United States Patent
Ahn et al.

(10) Patent No.: US 9,269,764 B2
(45) Date of Patent: Feb. 23, 2016

(54) GRAPHENE SEMICONDUCTOR AND ELECTRICAL DEVICE INCLUDING THE SAME

(71) Applicant: Samsung Electronics Co., Ltd., Suwon-si, Gyeonggi-do (KR)

(72) Inventors: Jong-ryoul Ahn, Seoul (KR); Jeong-tak Seo, Seoul (KR); Ji-hoon Park, Seoul (KR); Cheol-ho Jeon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/905,527

(22) Filed: May 30, 2013

(65) Prior Publication Data

US 2014/0034899 A1 Feb. 6, 2014

(30) Foreign Application Priority Data

Aug. 1, 2012 (KR) ........................ 10-2012-0084578

(51) Int. Cl.
| | |
|---|---|
| *H01L 29/16* | (2006.01) |
| *H01L 29/207* | (2006.01) |
| *H01L 29/786* | (2006.01) |
| *H01L 29/06* | (2006.01) |
| *H01L 21/02* | (2006.01) |
| *H01L 51/30* | (2006.01) |
| *H01L 51/40* | (2006.01) |
| *H01L 29/778* | (2006.01) |
| *C23C 18/08* | (2006.01) |
| *B82Y 99/00* | (2011.01) |
| *B82Y 30/00* | (2011.01) |

(52) U.S. Cl.
CPC ............... *H01L 29/06* (2013.01); *C23C 18/08* (2013.01); *H01L 21/0262* (2013.01); *H01L 21/02104* (2013.01); *H01L 21/02378* (2013.01); *H01L 21/02491* (2013.01); *H01L 21/02527* (2013.01); *H01L 21/02612* (2013.01); *H01L 21/02628* (2013.01); *H01L 21/02664* (2013.01); *H01L 29/1606* (2013.01); *H01L 29/778* (2013.01); *B82Y 30/00* (2013.01); *B82Y 99/00* (2013.01)

(58) Field of Classification Search
None
See application file for complete search history.

(56) References Cited

U.S. PATENT DOCUMENTS

| | | | | |
|---|---|---|---|---|
| 2011/0095268 | A1* | 4/2011 | Choi et al. | 257/29 |
| 2011/0309336 | A1* | 12/2011 | Shin et al. | 257/29 |
| 2012/0056161 | A1* | 3/2012 | Avouris et al. | 257/24 |

FOREIGN PATENT DOCUMENTS

| | | |
|---|---|---|
| JP | 2010-287811 A | 12/2010 |
| KR | 1020110045252 A | 5/2011 |

OTHER PUBLICATIONS

Liu, Xiaojie, C. Wang, Y. Yao, W. Lu, M. Hupalo, M. Tringides, and K. Ho. "Bonding and Charge Transfer by Metal Adatom Adsorption on Graphene." Physical Review B 83.23 (Jun. 10, 2011).*

Klintenberg, M., S. Lebegue, M. I. Katsnelson, and O. Eriksson. "Theoretical Analysis of the Chemical Bonding and Electronic Structure of Graphene Interacting with Group IA and Group VIIA Elements." Physical Review B 81.8 (2010).*

(Continued)

*Primary Examiner* — Joseph Schoenholtz
(74) *Attorney, Agent, or Firm* — Cantor Colburn LLP

(57) ABSTRACT

A graphene semiconductor including graphene and a metal atomic layer disposed on the graphene, wherein the metal atomic layer includes a metal, which is capable of charge transfer with the graphene.

14 Claims, 7 Drawing Sheets

(56) References Cited

OTHER PUBLICATIONS

Jin, Kyung-Hwan and Choi, Seon-Myeong and Jhi, Seung-Hoon, "Crossover in the adsorption properties of alkali metals on graphene", Phys. Rev. B, V. 82 No. 3, pp. 033414-033417 (Jul. 2010).*

Chan, Kevin T., J. B. Neaton, and Marvin L. Cohen. "First-principles Study of Metal Adatom Adsorption on Graphene." Physical Review B 77.23 (2008).*

L. Johansson, C. Xia and C. Virojanadara, "Na Induced Changes in the Electronic Band Structure of Graphene Grown on C-Face SiC," Graphene, vol. 2 No. 1, 2013, pp. 1-7.*

Lv, Ruitao, and Mauricio Terrones. "Towards New Graphene Materials: Doped Graphene Sheets and Nanoribbons." Materials Letters 78 (2012): 209-18.*

Pirkle, Adam, Robert M. Wallace, and Luigi Colombo. "In Situ Studies of Al[sub 2]O[sub 3] and HfO[sub 2] Dielectrics on Graphite." Applied Physics Letters 95.13 (2009): 133106.*

Farmer, Damon B., Hsin-Ying Chiu, Yu-Ming Lin, Keith A. Jenkins, Fengnian Xia, and Phaedon Avouris. "Utilization of a Buffered Dielectric to Achieve High Field-Effect Carrier Mobility in Graphene Transistors." Nano Letters 9.12 (2009): 4474-478.*

Liu, Xiaojie, C. Z. Wang, M. Hupalo, W. C. Lu, M. C. Tringides, Y. X. Yao, and K. M. Ho. "Metals on Graphene: Correlation between Adatom Adsorption Behavior and Growth Morphology." Physical Chemistry Chemical Physics 14.25 (2012): 9157.*

Bradley, D. C., and J. M. Thomas. "Metal Alkoxides as Precursors for Thin-Film Growth [and Discussion]." Philosophical Transactions of the Royal Society A: Mathematical, Physical and Engineering Sciences 330.1610 (1990): 167-71.*

Liu, Xiaojie, C. Wang, Y. Yao, W. Lu, M. Hupalo, M. Tringides, and K. Ho. "Bonding and Charge Transfer by Metal Adatom Adsorption on Graphene." Physical Review B 83.23 (2011).*

Liu, Xiaojie, C. Z. Wang, M. Hupalo, W. C. Lu, M. C. Tringides, Y. X. Yao, and K. M. Ho. "Metals on Graphene: Correlation between Adatom Adsorption Behavior and Growth Morphology," Physical Chemistry Chemical Physics 14.25 (2012): 9157.*

Caragiu et al "Alkali metal adsorption on graphite: a review", Journal of Physics: Condensed Matter 17, 2005, pp. R995-R1024.

Cortright, R.D., Davda, R.R., and Dumesic, J. A., Hydrogen from catalytic reforming of biomass-derived hydrocarbons in liquid water, Nature, vol. 418, Issue 6901, pp. 964-967 (2002).

Hwang et al., "Stability of graphene band structures against an external periodic perturbation: Na on graphene", Physical Review, B79, 2009, pp. 115439-1-115439-5.

Naourbakhsh et al., "Bandgap opening in oxygen plasma-treated graphene", Nanotechnology, vol. 21, 2010, pp. 1-9.

* cited by examiner

GRAPHENE SEMICONDUCTOR AND ELECTRICAL DEVICE INCLUDING THE SAME

CROSS-REFERENCE TO RELATED APPLICATIONS

This application claims priority to and the benefit of Korean Patent Application No. 10-2012-0084578, filed on Aug. 1, 2012, and all the benefits accruing therefrom under 35 U.S.C. §119, the content of which is incorporated herein in its entirety by reference.

BACKGROUND

1. Field

The present disclosure relates to a graphene semiconductor and electrical devices including the same, and more particularly, to graphene having semiconducting properties, thereby allowing for use in various electrical devices, such as transistors.

2. Description of the Related Art

Generally, graphite is an allotropic form of carbon having a structure in which two-dimensional ("2D") graphene sheets are stacked. There are two allotropic forms of graphite having different stacking arrangements: hexagonal and rhombohedral. The carbon atoms of the graphene sheets are connected to each other in an extended array of hexagonal rings. Recently, one or more graphene sheets were removed from graphite to study the characteristics of a single graphene sheet, and it was observed that a single graphene sheet has very useful characteristics as compared to other materials.

For example, the single graphene sheet has metallic properties, and thus, is a conductor. Thus, a single graphene sheet does not have a band gap, as illustrated in FIG. 1. Accordingly, there remains a need for a graphene having semiconducting properties.

SUMMARY

Provided is graphene having semiconducting properties.

Provided is a method enabling reversible control of a band gap of the graphene.

Provided are electrical devices including the graphene having semiconducting properties.

Additional aspects will be set forth in part in the description which follows and, in part, will be apparent from the description.

According to an aspect of the present disclosure, a graphene semiconductor includes graphene; and a metal atomic layer disposed on the graphene, wherein the metal atomic layer includes a metal, which is capable of charge transfer with the graphene.

According to another aspect of the present disclosure, a method of manufacturing a graphene semiconductor includes disposing graphene on a substrate; and disposing a metal atomic layer on the graphene to manufacture the graphene semiconductor.

According to another aspect of the present disclosure, a method of selecting a graphene band gap includes disposing graphene on a substrate; disposing a metal atomic layer on the graphene; and forming a first oxide layer on the graphene by oxidizing the metal atomic layer to select the band gap of the graphene.

According to another aspect of the present disclosure, an electrical device includes the graphene semiconductor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
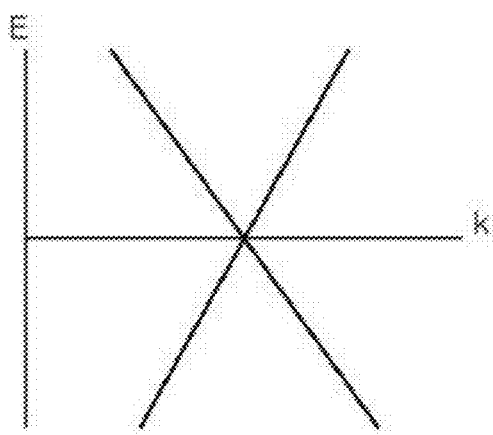
FIG. 1 illustrates a band gap of a graphene.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. As used herein, the term "and/or" includes any and all combinations of one or more of the associated listed items. The term "or" means "and/or." Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain, saturated, monovalent hydrocarbon group (e.g., methyl or hexyl).

"Alkenyl" means a straight or branched chain, monovalent hydrocarbon group having at least one carbon-carbon double bond (e.g., ethenyl (—HC=CH2)).

"Alkynyl" means a straight or branched chain, monovalent hydrocarbon group having at least one carbon-carbon triple bond (e.g., ethynyl).

"Alkoxy" means an alkyl group that is linked via an oxygen (i.e., alkyl-O—), for example methoxy, ethoxy, and sec-butyloxy groups.

"Aryl" means a monovalent group formed by the removal of one hydrogen atom from one or more rings of an arene (e.g., phenyl or napthyl).

"Arylalkyl" means a substituted or unsubstituted aryl group covalently linked to an alkyl group that is linked to a compound (e.g., a benzyl is a C7 arylalkyl group).

The prefix "hetero" means that the compound or group includes at least one a heteroatom (e.g., 1, 2, or 3 heteroatom(s)), wherein the heteroatom(s) is each independently N, O, S, Si, or P.

According to an embodiment, a graphene semiconductor including a metal atomic layer is provided.

The term "graphene" as used herein refers to a polycyclic aromatic molecule including a plurality of carbon atoms connected to each other by a covalent bond. The plurality of carbon atoms may form a 6-membered ring as a standard repeating unit, and may further include 5-membered rings and/or 7-membered rings. Thus, graphene appears as a monolayer of covalently bonded carbon atoms generally having $sp^2$ hybridization and substantially may have a thickness of a carbon atomic layer. A graphene monolayer generally has a light transmittance of about 97% to about 98%. A plurality of graphene layers is often referred to in the art as graphite. However, for convenience, "graphene" as used herein may be a single layer, or also may comprise a plurality of layers of carbon. Thus graphene, as used herein, may have a multiply layered structure formed by stacking single layers of graphene. In an embodiment, graphene, as used herein, may comprise 1 to about 300 layers.

The term "metal atomic layer" as used herein refers to a layer having 1 to about 100 atomic layers of a metal.

As shown in FIG. 1, graphene generally is conductive when a band gap is not present. In this regard, a band gap is desired to serve as a switch that controls electrical current so as to use the graphene, which is a conductor (band gap 0), in a semiconductor device.

When graphene is grown on a substrate, a little band gap (~0.3 electron volt, "eV") is known to appear due to interaction between the substrate and a lower substrate. However, the band gap is still much less than a band gap desired for by a semiconductor device.

According to an embodiment, a metal atomic layer is disposed on graphene to induce the formation of a band gap of a selected size or larger, and the band gap size may be selected as desired. Such graphene may be used in a semiconductor device having favorable on-off characteristics.

Since graphene has no band gap due to the unique symmetry of a graphene lattice, a band gap may be formed by a method of artificially breaking, e.g., reducing, the symmetry by applying an external influence. Here, although the method allows breaking the symmetry of the graphene lattice, unique electron mobility characteristics of the graphene may be preserved by keeping the graphene lattice intact.

When the metal atomic layer, which is capable of charge transfer with the graphene, is disposed on the graphene, the metal atomic layer increases a band gap of the graphene as it breaks the symmetry of the graphene lattice without changing the graphene itself.

The metal atomic layer may be formed on the graphene through non-chemical bonding, such as adsorption or the like, and a graphene band gap may be adjusted by controlling an extent of adsorption of the metal atoms. While not wanting to be bound by theory, it is understood that as a result of the adsorption, the graphene adsorbed with the metal atomic layer may have semiconducting properties. That is, the metal atomic layer, which in an embodiment is non-chemically bonded, i.e. adsorbed, on a surface of the graphene, may cause charge separation of the graphene, thereby forming a band gap. Such graphene may have semiconducting properties.

Since the band gap may be formed by non-chemical bonding, for example, physical bonding such as adsorption, a net charge of graphene may be zero. Accordingly, if a band gap is formed in a graphene by using the foregoing method, graphene itself is not damaged since the band gap is formed by mere charge localization. Thus, such graphene may have semiconducting properties by having a band gap without a significant decrease in the high mobility of graphene.

Since a larger band gap results in a larger value of $I_{on}/I_{off}$, the characteristics of an electrical device may be improved by including the graphene monolayer formed as described above. The band gap formed in the graphene monolayer may be about 0.4 electron volt (eV) or greater, for example, about 0.45 eV to about 0.8 eV, or about 0.6 eV to about 0.8 eV.

The band gap may be selected according to the kind or concentration of the metal that forms the metal atomic layer. The metal may comprise an alkali metal. For example, the alkali metal may include lithium (Li), sodium (Na), potassium (K), rubidium (Rb), cesium (Cs), francium (Fr), or a combination thereof. In an embodiment, the metal may be sodium (Na).

The metal may be present on a surface of the graphene, and may be non-chemically bonded to, for example, adsorbed on, a surface by atomic layer deposition ("ALD") or chemical vapor deposition ("CVD"). By such way of bonding, the metal may form a metal atomic layer, e.g. a metal nano-structure, on the graphene, and the metal nano-structure may have a two-dimensional structure, like a thin film. The method of disposing the metal nano-structure on the graphene may be performed at room temperature, for example at about 300 Kelvin ("K") as a relaxation process.

The nano-structure of the metal on the graphene may be in a form of a two-dimensional thin film containing various shapes such as a nano-dot, a nano-ribbon, a nano-cavity, a nano-rod, a nano-cluster, and a nano-island, or a combination of thereof, and may have a thickness of about 1-atomic layer to about 100-atomic layers, specifically about 2 atomic layers to about 80 atomic layers, or may be in the range of about 2 to about 200 Angstroms ("Å"), specifically about 4 to about 150 Å. The metal may occupy, e.g., cover, about 30% to about 99%, for example, about 50% to about 90%, of an entire surface of the graphene.

As the two-dimensional nano-structure of the metal atomic layer is disposed on a surface of the graphene through non-chemical (e.g., physical) bonding, charge localization occurs, and thus the graphene has a band gap of a selected size. Since the band gap is formed without damaging the graphene lattice, such graphene may display semiconducting properties while retaining its unique properties, such as high mobility.

A substrate may be disposed under the graphene with the metal atomic layer as described above. The substrate may include an inorganic substrate. The substrate may comprise a silicon (Si) substrate, a silicon carbide (SiC) substrate, a glass substrate, a GaN substrate, a silica substrate, a nickel (Ni) substrate, a cobalt (Co) substrate, an iron (Fe) substrate, a platinum (Pt) substrate, a palladium (Pd) substrate, a gold (Au) substrate, an aluminum (Al) substrate, a chromium (Cr) substrate, a copper (Cu) substrate, a manganese (Mn) substrate, a molybdenum (Mo) substrate, a rhodium (Rh) substrate, an iridium (Ir) substrate, a tantalum (Ta) substrate, a titanium (Ti) substrate, a tungsten (W) substrate, a uranium (U) substrate, a vanadium (V) substrate, a zirconium (Zr) substrate, a plastic substrate, or a combination thereof, but is not limited thereto.

The metal atomic layer may be deposited on the graphene by any of various deposition methods, for example, ALD, CVD, sputtering, or evaporation.

A graphene semiconductor having a band gap as a metal atomic layer may be formed in the same manner as described above, may recover an original low band gap when a part of the metal atomic layer is oxidized through a subsequent oxidation process and an effect caused by metal atomic adsorption is removed.

That is, a surface of the metal atomic layer converts to a metal oxide as a result of the oxidation process. For example, when the metal atom is sodium, a sodium oxide is formed on the metal atomic layer. The sodium oxide serves as a passivation layer to suppress charge transfer between the metal atomic layer and the graphene and remove the semiconducting properties introduced to the graphene, and thus allows an original low band gap to be recovered. Such graphene may not have semiconducting properties. Accordingly, selection of a band gap of the graphene may be reversible.

The method of selecting a band gap with respect to graphene may be repeatedly used. That is, the disposing and oxidizing processes of the metal atomic layer may be repeatedly performed, and thus a reversible control of a band gap with respect to graphene is enabled.

Therefore, graphene with or without a band gap through a reversible control of a band gap size with respect to the graphene may be used in devices for various purposes, as desired.

A first oxide layer disposed on the metal atomic layer by the oxidation process may serve as a buffer layer or a first passivation layer, and a thickness of the first oxide layer may be in a range of about 1 nanometer (nm) to about 100 nm, for example, about 5 nm to about 30 nm. When a thickness of the first oxide layer is in the foregoing range, oxygen penetration up to an inner metal atomic layer may be prevented. In order to prevent such oxygen penetration, the first oxide layer may be formed by oxidizing the surface of the metal atomic layer under an oxygen atmosphere at a selected pressure, e.g. about $1 \times 10^{-5}$ torr to about $1 \times 10^{-7}$ torr, for about 1 to about 20 hours, e.g. about 2 to about 10 hours.

Introduction of a band gap to the graphene through the metal atomic layer and control of the band gap of the graphene through formation of the first oxide layer may be repeatedly performed for, e.g., about 2 to about 100 times, or about 2 to about 10 times.

Forming the first oxide layer may be followed by forming another oxide layer as an additional second passivation layer. For example, a second oxide layer may be formed of a hafnium oxide, a silicon oxide, or the like.

A reversible method for control of the graphene band gap can be provided economically and with suitable process complexity and does not damage a lattice structure of the graphene. Thus the reversible control method allows the unique and fine characteristics of the graphene to be maintained and enables semiconducting properties to be introduced to or removed from the graphene.

The graphene on which the metal atomic layer is to be disposed may be a graphene monolayer, and when a metal, for example, an alkali metal, is disposed with a thickness of an atomic layer on the graphene monolayer, a band gap may be formed in the graphene monolayer, and thus, the graphene monolayer may display semiconducting properties. The graphene monolayer may be manufactured, though not limited thereto, by using any of various methods, some of which will now be described briefly.

Graphene Formation Process (Vapor-Phase Method)

Graphene may be formed on a graphitization catalyst metallic layer using any suitable method, for example, a vapor-phase method or a liquid-phase method.

A vapor-phase method will now be described briefly. First, a graphitization catalyst is formed in the form of a film, and then heat-treated while contacting a vapor-phase carbon supply source thereto, thereby forming graphene. Then, the formed graphene is grown in cooler conditions. That is, a vapor carbon supply source is loaded at a given pressure into a chamber in which a graphitization catalyst is present in a form of a film and then, heat-treated at a given temperature for a given time period, thereby forming graphene in which carbon elements present in the vapor carbon supply source are bonded to each other to form a hexagonal planar structure. Then, the graphene is cooled at a given cooling rate to form a graphene sheet having a uniform structural arrangement on the graphitization catalyst metallic layer.

In the graphene sheet formation process described above, the carbon supply source may comprise any suitable material to supply carbon in a vapor phase at a temperature of 300° C. or more. The carbon supply source may be any suitable carbon-containing compound. For example, the carbon supply material may be a compound including six or less carbon atoms, a compound including four or less carbon atoms, or a compound including two or less carbon atoms. For example, the carbon supply material may include carbon monoxide, ethane, ethylene, ethanol, acetylene, propane, propylene, butane, butadiene, pentane, pentene, cyclopentadiene, hexane, cyclohexane, benzene, toluene, or a combination thereof.

The carbon supply material may be loaded at a given pressure into a chamber in which a graphitization catalyst is present. The vapor carbon supply material may be used alone or in a combination with an inert gas, such as helium or argon.

Further, hydrogen may be used together with the vapor carbon supply material. Hydrogen maintains a surface of the metal layer containing the catalyst clean, and thus may control the reaction of the vapor carbon supply material with the metal layer. Hydrogen may be used in a range of about 5 to about 40% by volume of the chamber, in a range of about 10 to about 30% by volume, or in a range of about 15 to about 25% by volume, based on a total volume of the chamber.

When the carbon supply source is loaded into the chamber in which the graphitization catalyst is present as a film and then heat-treated at a given temperature, graphene is formed on a surface of the graphitization catalyst metallic layer. The heat treatment temperature may play a role in forming the graphene, and may be, for example, in a range of about 300 to about 2,000° C., or in a range of about 500 to about 1,500° C.

An amount of the formed graphene may be controlled by performing the heat treatment at a given temperature for a given time period. That is, when the heat treatment process is performed for a relatively long time period, more graphene is formed, and the thickness of the formed graphene would be greater. When the heat treatment process is performed for a relatively short time period, the thickness of graphene is small. Accordingly, in manufacturing a graphene monolayer having a desired thickness, the heat treatment time may also play a role, in addition to the kind and supply pressure of a carbon supply source, the size of a graphitization catalyst, and the size of a chamber. The heat treatment time may be in a range of, for example, about 0.001 to about 1,000 hours.

A heat source for the thermal treatment is not limited, and may be induction heat, radiant heat, laser, infrared ("IR") heat, microwaves, plasma, ultraviolet ("UV") rays, surface plasmon heat, or a combination thereof. The heat source is attached to the chamber and increases the temperature of the chamber to a given level.

After the heat treatment, a cooling process may be selectively performed on the resulting product obtained after the thermal treatment. The cooling process is performed so that the patterned graphene may be grown and arranged uniformly. Because sudden cooling may generate cracks in formed graphene sheets, the resulting product may be slowly cooled at a uniform rate. For example, the resulting product may be cooled at a rate from about 0.1° C. to about 10° C. per minute, or may be cooled naturally (e.g., by ambient convection). The cooling of the resulting product naturally is performed by simply removing the heat source used for the thermal treatment, and by removing only the heat source, a sufficient cooling rate may be obtained.

The heat treatment and the cooling process described above may be performed once. However, the cycle of heating and cooling may be repeatedly performed to generate graphene having a dense structure.

The graphitization catalyst is used in the form of a film having a planar structure, and contacts the carbon supply source so as to facilitate the formation of a hexagonal planar structure of carbon elements provided from the carbon supply source. The graphitization catalyst may be a catalyst used in graphite synthesis, carbonation induction, or carbon nanotube production. For example, the graphitization catalyst may include Ni, Co, Fe, Pt, Au, Al, Cr, Cu, Mg, Mn, Mo, Rh, Si, Ta, Ti, W, U, V, Zr, or a combination thereof.

Graphene manufactured using the vapor-phase method described above has a uniform structure without defects since vapor pure materials and a high-temperature heat treatment are used.

Graphene Formation Process (Polymerization)

The graphene monolayer may also be formed by polymerization. The polymerization process is performed in order to contact the graphitization catalyst metallic layer and a liquid-phase carbon supply source. For example, a carbon-containing polymer as a liquid-phase carbon supply source may be coated on the graphitization catalyst metallic layer described above.

Any carbon-containing polymer may be used as a carbon supply source without limitation. For example, a self-assembled polymer may be used since the self-assembled polymer may be vertically arranged in a regular pattern on the graphitization catalyst metallic layer, and thus the resulting patterned graphene may have a high density.

The self-assembled polymer, which may form a self-assembled layer, may include a self-assembled polymer such as an amphiphilic polymer, a liquid crystal polymer, a conductive polymer, or a combination comprising at least one of the foregoing polymers.

Because the amphiphilic polymer has both hydrophilic and hydrophobic functional groups in a structure thereof, the amphiphilic polymer may be arranged in a uniform structural arrangement, such as a Langmuir-Blodgett arrangement, a dipping arrangement, or a spin arrangement, in an aqueous solution. The amphiphilic polymer may include a hydrophilic functional group such as an amino group, a hydroxyl group, a carboxyl group, a sulfate group, a sulfonate group, a phosphate group, a salt thereof, or a combination thereof; and a hydrophobic functional group such as a halogen atom, a $C_1$-$C_{30}$ alkyl group, a $C_1$-$C_{30}$ halogenated alkyl group, a $C_2$-$C_{30}$ alkenyl group, a $C_2$-$C_{30}$ halogenated alkenyl group, a $C_2$-$C_{30}$ alkynyl group, a $C_2$-$C_{30}$ halogenated alkynyl group, a $C_1$-$C_{30}$ alkoxy group, a $C_1$-$C_{30}$ halogenated alkoxy group, a $C_1$-$C_{30}$ heteroalkyl group, a $C_1$-$C_{30}$ halogenated heteroalkyl group, a $C_6$-$C_{30}$ aryl group, a $C_6$-$C_{30}$ halogenated aryl group, a $C_7$-$C_{30}$ arylalkyl group, a $C_7$-$C_{30}$ halogenated arylalkyl group, or a combination thereof. Examples of the amphiphilic polymer include decanoic acid, lauric acid, palmitic acid, stearic acid, myristoleic acid, palmitoleic acid, oleic acid, stearidonic acid, linolenic acid, caprylamine, laurylamine, stearylamine, oleylamine, or a combination thereof.

The liquid crystal polymer may adopt a uniform orientation in liquid. The conductive polymer may form a crystalline structure by self-assembling in a layer of the polymer while a solvent used to dissolve the conductive polymer vaporizes from the layer. Accordingly, the liquid crystal polymer and the conductive polymer may be disposed, e.g., arranged, by a method, such as dipping, spin coating, or the like. Examples of the liquid crystal polymer and the conductive polymer include a polyacetylene-based polymer, a polypyrrole-based polymer, a polythiophene-based polymer, a polyaniline-based polymer, a polyfluoro-based polymer, a poly(3-hexylthiophene)-based polymer, a polynaphthalene-based polymer, a poly(p-phenylene sulfide)-based polymer, a poly(p-phenylene vinylene)-based polymer, or a combination thereof.

The carbon-containing polymer may include at least one polymerizable functional group, such as a carbon-carbon double bond or carbon-carbon triple bond, in a structure thereof. The at least one polymerizable functional group may enable polymerization between polymers through a polymerization process, such as ultraviolet light irradiation, after forming a layer thereof. The carbon supply material obtained therefrom may have a large molecular weight and thus substantially reduce or effectively prevent carbon from volatizing during thermal treatment.

Such a carbon-containing polymer may be polymerized before or after being coated on the graphitization catalyst metallic layer. In an embodiment, when the carbon-containing polymer is polymerized before being coated on the graphitization catalyst metallic layer, a polymerization layer obtained through a separate polymerization process may be transferred on the graphitization catalyst metallic layer to obtain a carbonaceous material layer.

The carbon-containing polymer may be arranged on the graphitization catalyst metallic layer by any suitable method. For example, the carbon-containing polymer may be disposed, e.g., arranged, on a surface of the graphitization catalyst metallic layer using a Langmuir-Blodgett method, a dip coating method, a spin coating method, or a vacuum-deposition method. Through such a coating method, the carbon-containing polymer may be coated on a portion of or an entire surface of a substrate or the graphitization catalyst metallic layer.

Among the self-assembled organic materials described above, the molecular structure of the amphiphilic organic material includes both a hydrophilic portion and a hydrophobic portion. A hydrophilic portion of one amphiphilic organic material binds to the hydrophilic graphitization catalyst, and thus, becomes evenly arranged on the graphitization catalyst metallic layer. As a result, a hydrophobic portion of the amphiphilic organic material becomes exposed in a direction away from the substrate, and thus binds to a hydrophobic portion of another amphiphilic organic material that is not bonded to the graphitization catalyst. When the amount of the amphiphilic organic material is sufficient, the amphiphilic organic material may sequentially stack on the graphitization catalyst film by way of hydrophilic-hydrophobic interactions. Once the amphiphilic organic material forms a plurality of layers, a graphene layer is formed by a thermal treatment. Accordingly, by selecting a suitable amphiphilic organic material, and selecting a thickness of layers of the amphiphilic organic material by varying the amount of the amphiphilic organic material, a monolayer of graphene may be obtained. Thus, graphene having a desired thickness may be prepared.

Graphene Formation Process (Liquid-Phase Method)

The graphene monolayer may also be formed using a liquid-phase method. In the liquid-phase method, the graphitization catalyst metallic layer contacts a liquid carbon supply material and then the resulting material is heat-treated to form graphene.

In the contacting of the graphitization catalyst metallic layer and the liquid carbon supply material, the graphitization catalyst metallic layer is immersed in the liquid carbon supply material as a carbonaceous material and then pre-heating is performed thereon.

A liquid carbon supply material used in the liquid-phase method may be any organic solvent containing carbon and may be thermally decomposed by a reaction with the graphitization catalyst. The hydrocarbon material may be a polar organic solvent or a non-polar organic solvent having a boiling point of about 60° C. to about 400° C. Examples of such organic solvents may include alcohol-based organic solvents, ether-based organic solvents, ketone-based organic solvents, ester-based organic solvent, organic acid-based organic solvents, or a combination thereof. An alcohol-based organic solvent or an ether-based organic solvent may be used in terms of adsorption to the graphitization catalyst, reactivity, and reducing power. Examples of alcohol-based organic solvents include monovalent alcohols and polyvalent alcohols, which may be used alone or in a combination thereof. Examples of monovalent alcohols include propanol, pentanol, hexanol, heptanol, octanol, or a combination thereof, and examples of polyvalent alcohols include propylene glycol, diethylene glycol, dipropylene glycol, triethylene glycol, tripropylene glycol, octylene glycol, tetraethylene glycol, neopentyl glycol, 1,2-butandiol, 1,3-butandiol, 1,4-butandiol, 2,3-butandiol, dimethyl-2,2-butandiol-1,2, dimethyl-2, 2-butandiol-1,3, or a combination thereof. These monovalent alcohols and polyvalent alcohols may further include an ether group, in addition to a hydroxyl group.

When such a liquid carbon supply material is used, carburization may be performed by pre-heating. The liquid carbon supply material may be thermally decomposed during the pre-heating due to a reaction with the graphitization catalyst. A thermal decomposition process of a liquid hydrocarbon material by a graphitizing catalyst is well known, e.g., as described in Cortright, R. D., Davda, R. R., and Dumesic, J. A., Hydrogen from catalytic reforming of biomass-derived hydrocarbons in liquid water, Nature, Vol. 418, page 964 (2002), the content of which is incorporated herein in its entirety by reference. For example, thermal decomposition products of an organic solvent such as polyvalent alcohol may include an alkane, $H_2$, $CO_2$, and $H_2O$, and a carbon component of the thermal decomposition products permeates into a catalyst.

The pre-heating for thermal decomposition may be performed at a temperature of about 100° C. to about 400° C. for about 10 minutes to about 24 hours.

In addition, when a carburization method is used, the amount of carbon in a catalyst may be controlled by varying the degree of carburization. Thus, the thickness of a graphene layer formed in a subsequent process may also be controlled to a thickness at a monolayer level. For example, if a liquid carbon supply material that is prone to thermal decomposition is used, a large amount of carbon may be decomposed and permeate into the catalyst during the thermal decomposition reaction of the liquid carbon supply material. In addition, the amount of carbon that permeated into the catalyst may also be controlled by varying the preheating temperature and duration of the process. Accordingly, the rate of growth of graphene may be controlled. Thus, it may be easier to control the thickness of a graphene layer to a monolayer level.

As described above, a carbon-containing polymer or a liquid carbon supply source may be brought into contact with the graphitization catalyst metallic layer, and a subsequent heat treatment may be performed thereon, thereby forming graphene on the graphitization catalyst metallic layer. The heat treatment may be performed in the same manner as in the vapor-phase method.

Graphene Formation Process (SiC Growth Method)

Graphene may be directly formed on a substrate without a separate carbon source. The substrate may be, for example, a SiC wafer. The graphene may be epitaxially grown on the SiC wafer, and the graphene may be grown on both silicon and carbon surfaces of the SiC wafer. The graphene with better uniformity may be grown on the silicon surface rather than the carbon surface of the SiC wafer.

The SiC layer, as an example of the substrate, may have a thickness in a range of about 1 nanometer (nm) to about 500 micrometers (μm). Within the thickness range, a sufficient amount of carbon may be supplied for growth of the graphene. By heat-treating the resulting material, a graphene structure may be formed.

When a carbon-containing substrate, e.g., a SiC wafer, is used as the substrate, the wafer itself can be a carbon source, and a separate carbon source may be omitted. Here, Si—C bonds inside the wafer may be weakened due to the heat-treatment, thus carbon becomes dissociated and released to the surface, and the released carbons are bonded to one another and form graphene.

The graphene may be formed under a heat-treating condition of vacuum or an inert atmosphere at a temperature of about 1,000° C. to about 2,000° C. for about 1 minute to about 2 hours.

The inert atmosphere denotes a container filled with an inert element such as argon or helium, and a pressure in the container may be in a range of about 100 torr to about 700 torr.

Graphene manufactured by using various methods described above may have an area of 1 square centimeter ($cm^2$) or more, and the formed graphene may have small defects. Thus, the graphene monolayer may have 10 or fewer wrinkles in a unit area of 1,000 square micrometers ($\mu m^2$). In addition, the graphene monolayer may occupy 99% or more of a unit area of 1 square millimeter ($mm^2$).

Graphene that has semiconducting properties due to formation of a metal atomic layer on the prepared graphene may be used in various electrical devices, for example, a sensor, a bipolar junction transistor, a field effect transistor, a heterojunction bipolar transistor, a single electron transistor, a light-emitting diode, or an organic electroluminescent diode.

Figure 2:
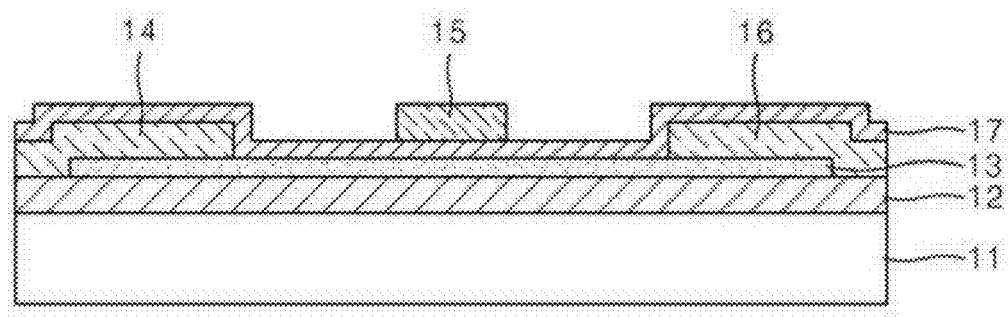
FIG. 2 is a schematic view of an embodiment of a field effect transistor.

FIG. 2 is a schematic view of an embodiment of a field effect transistor. Referring to FIG. 2, a silica substrate 12 is disposed on a substrate 11, and a metal atomic layer-containing graphene 13 with semiconducting properties is disposed on the silica substrate 12. A source electrode 14 and a drain electrode 16 are disposed on left and right sides of the metal atomic layer-containing graphene 13, respectively, and an insulating layer 17 spaces the source and drain electrodes 14 and 16 from a gate electrode 15. In this regard, a current flowing between the source and drain electrodes 14 and 16 is controlled by applying a voltage to the gate electrode 15. That is, the metal atomic layer-containing graphene 13 constitutes a channel region, and a current flowing between the source electrode 14 and the drain electrode 16 is controlled by applying a voltage to the gate electrode 15, thereby performing on/off operations.

Here, the distance between the source electrode 14 and the drain electrode 16 is dependent upon the purpose of a field effect transistor, and may be in a range of about 0.1 μm to about 1 mm. For example, the distance between the source electrode 14 and the drain electrode 16 may be in a range of about 1 μm to about 100 μm, for example, about 5 μm to about 100 μm.

In the field effect transistor according to an embodiment, the insulating layer 17 may be formed of any electrically insulating material that is formed as a thin film. Examples of the electrically insulating material may include a metal oxide (including an oxide of silicon), a metal nitride (including a nitride of silicon), a polymer, or a low molecular weight organic material, each of which has an electrical resistivity of 10 ohm×centimeter (Ω×cm) or more. For example, the insulating layer 17 may comprise an inorganic oxide having a high relative dielectric constant.

Examples of the inorganic oxide include silicon oxide, aluminum oxide, tantalum oxide, titanium oxide, tin oxide, vanadium oxide, titanium acid barium strontium, zirconium acid titanium acid barium, zirconium acid titanium acid lead, titanium acid lead lanthanum, titanium acid strontium, titanium acid barium, barium magnesium fluoride, lanthanum oxide, fluorine oxide, magnesium oxide, bismuth oxide, titanium acid bismuth, niobium oxide, titanium acid strontium bismuth, tantalum acid strontium bismuth, tantalum pentoxide, tantalum acid niobium acid bismuth, trioxide yttrium, or a combination thereof. For example, the inorganic oxide may be silicon oxide, aluminum oxide, tantalum oxide, titanium oxide, or a combination thereof.

In addition, an inorganic nitride such as a silicon nitride ($Si_3N_4$, $Si_xN_y$ (x, y>0)) or an aluminum nitride may also be used to form the insulating layer 17.

The insulating layer 17 may also be formed using a precursor material containing a metal alkoxide metal. For example, a solution including the precursor material may be coated on a substrate and then subjected to a chemical solution treatment including a heat treatment process, thereby forming an insulating layer.

The metal alkoxide may comprise a metal and an alkoxide group. The metal of the alkoxide metal may be a transition metal, lanthanide, a main group element, or a combination thereof. For example, the metal may be barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), yttrium (Y), or a combination thereof. The alkoxide of the metal alkoxide may be derived from an alcohol or an alkoxy alcohol. Examples of the alcohol include methanol, ethanol, propanol, iso-propanol, butanol, iso-butanol, or a combination thereof. Examples of the alkoxy alcohol includes methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol, heptoxy propanol, or a combination thereof.

If the insulating layer 17 comprises the foregoing materials, polarization in the insulating layer 17 may be facilitated, and a threshold voltage for driving a transistor may be lowered. In addition, when a silicon nitride such as $Si_3N_4$, $Si_xN_y$, $SiON_x$ (x, y $>$ 0), or a combination thereof is used to form the insulating layer 17, a depletion layer may be more easily formed and the threshold voltage for driving a transistor may be further lowered.

Examples of the low molecular weight organic material include polyimide, polyamide, polyester, polyacrylate, an optical radical polymerization system, a photocurable resin of an optical cation polymerization system, an acrylonitrile-containing copolymer, polybiphenole, polyvinylalcohol, a novolac resin, cyanoethylpullulan, or a combination thereof.

Examples of the polymer include wax, polyethylene, polychloroprene, polyethylene terephthalate, polyoxymethylene, polyvinylchloride, polyvinylidene fluoride, polymethylmethacrylate, polysulfone, polycarbonate, polyimidecyanoethyl fullerene, poly(vinylphenol)("PVP"), poly(methyl methacrylate)("PMMA"), polycarbonate ("PC"), polystyrene ("PS"), polyolefin, polyacrylamide, poly(acrylic acid), novolak resin, resol resin, polyimid, polyxylene, epoxy resin, a polymer having a high dielectric constant such as pullulan, or a combination thereof.

The insulating layer 17 may be a mixed layer comprising at least one materials selected from the inorganic or organic compounds described above, or may have a stacked structure including layers formed of the inorganic and organic compounds. In this regard, the performance of a manufactured device may be controlled by mixing a material having a high dielectric constant and a material having water repellency or by stacking a layer formed of a material having a high dielectric constant and a layer formed of a material having water repellency.

The insulating layer 17 may be formed using a dry process, a coating process, or a wetting process. Examples of the dry process include a vacuum deposition method, a molecular beam epitaxial growth method, an ion cluster beam method, a low energy ion beam method, an ion plating method, a chemical vapor deposition ("CVD") method, a sputtering method, and an atmospheric plasma method. Examples of the coating method include a spray coating method, a spin coating method, a blade coating method, a dip coating method, a casting coating method, a roll coating method, a bar coating method, and a dye coating method. Examples of the wetting process include a printing method and an ink-jetting method. These methods may be appropriately selected according to a material for forming the insulating layer. The wetting process may be performed using a sol-gel method. An example of the wetting process is a sol-gel method in which a dispersion prepared by dispersing particulates of inorganic oxide in an organic solvent or water by optionally using a dispersing agent such as a surfactant is coated and dried, or a solution of an oxide precursor, for example, alkoxide, is coated and then dried.

A metallic atomic layer and/or a metallic ion layer may be further formed between the alkali metal-containing graphene monolayer 13 as a semiconductor layer and the insulating layer 17. The metallic atomic layer may include Zn, Al, Ga, Zr, Ni, Co, Pd, or a combination thereof. The metallic ion layer may include ions of Zn, Al, Ga, Zr, Ni, Co, Pd, or a combination thereof, each of which may be present in a form of a metallic salt. An anion corresponding to the metallic salt may be halogen, $(-C(=O)O)^{1-}$, $NO_3^{2-}$, $SO_4^{2-}$, $CO_3^{-2}$, or a combination thereof. The metallic atomic layer and/or metallic ion layer may have a thickness equivalent to one through three layered structures of a metallic atom or a metallic ion.

The metal atomic or metal ionic layer may be formed using any method known in the field. For example, the metal atomic or metal ionic layer may be formed using a dry process, a coating process, or a wetting process. Examples of the dry process include a vacuum deposition method, a molecular beam epitaxial growth method, an ion cluster beam method, a low energy ion beam method, an ion plating method, a chemical vapor deposition ("CVD") method, a sputtering method, or an atmospheric plasma method. Examples of the coating method include a spray coating method, a spin coating method, a blade coating method, a dip coating method, a casting coating method, a roll coating method, a bar coating method, or a dye coating method. Examples of the wetting process include a printing method or an ink-jetting method. These methods may be appropriately selected according to a material for forming the insulating layer.

In the field-effect transistor, for example, a thin film transistor ("TFT"), a substrate that supports the structure of the TFT may be a glass substrate, an inorganic compound, such as a metal oxide or nitride, substrate, a plastic film (PET, PES, or PC), a metal substrate, or a composite or stack thereof. In addition, if other elements, e.g., not the substrate, sufficiently support the structure of a thin film transistor, the substrate may not be used. In addition, in general, a silicon (Si) wafer is used as a substrate. In this regard, Si itself is used as both a gate electrode and a substrate. Moreover, a surface of a Si substrate is oxidized to form $SiO_2$, which functions as an insulating layer. In this regard, a metal layer, for example, a gold (Au) layer, as an electrode for connection to a lead line may be formed on the Si substrate functioning both as a substrate and a gate electrode.

In a TFT according to an embodiment, gate, source, and drain electrodes may include any conductive materials. For example, each of the gate, source, and drain electrodes may comprise platinum (Pt), gold (Au), silver (Ag), nickel (Ni), chromium (Cr), copper (Cu), iron (Fe), tin (Sn), hard lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), tin oxide antimony, indium tin oxide ("ITO"), fluoride-doped zinc oxide, zinc (Zn), carbon (C), graphite, glass-phase carbon, silver paste, carbon paste, lithium (Li), beryllium (Be), sodium (Na), magnesium (Mg), potassium (K), calcium (Ca), scandium (Sc), titanium (Ti), manganese (Mn), zirconium (Zr), gallium (Ga), niobium (Nb), an alloy containing sodium (Na) and potassium (K), magnesium (Mg), lithium (Li), aluminum (Al), a combination comprising magnesium (Mg) and copper (Cu), a combination comprising magnesium (Mg) and silver (Ag), a combination comprising magnesium (Mg) and aluminum (Al), a combination comprising magnesium (Mg) and indium (In), a combination comprising aluminum (Al) and aluminum oxide, a combination comprising lithium (Li) and aluminum (Al), or a combination thereof. These materials may be deposited by sputtering or vacuum deposition.

In a TFT according to another embodiment, source and drain electrodes may comprise a fluid electrode material such as a solution, paste, ink, or dispersion of such conductive materials. A metallic particulate-containing dispersion may be any known conductive paste, and may be a dispersion that has metallic particulates having a particle diameter of about 0.5 nm to about 50 nm, or about 1 nm to about 10 nm. Such metallic particulates may be, for example, platinum (Pt), gold (Au), silver (Ag), nickel (Ni), chromium (Cr), copper (Cu), iron (Fe), tin (Sn), lead (Pb), tantalum (Ta), indium (In), palladium (Pd), tellurium (Te), rhenium (Re), iridium (Ir), aluminum (Al), ruthenium (Ru), germanium (Ge), molybdenum (Mo), tungsten (W), zinc (Zn), or a combination thereof.

Such metallic particulates may be dispersed in a dispersion medium such as water or any organic solvent by using a dispersion stabilizer such as an organic material, and the obtained dispersions may be used to form the source electrode and the drain electrode. The dispersions of such metallic particulates may be prepared using a physical method, such as sputtering or metal vapor synthesis, or a chemical method in which metallic ions are reduced into a liquid phase to generate metallic particulates. Examples of the chemical method include a colloid method and a co-precipitation method.

The source electrode and the drain electrode are molded using such metallic particulate dispersions, a solvent used is dried, and the molded structure is heated at a temperature of about 100° C. to about 300° C., for example, about 150° C. to about 200° C. while maintaining the shape of the molded structure, thereby thermally fusing metallic particulates to form an electrode pattern having a target shape.

In addition, the gate, source, and drain electrodes may be formed of a known conductive polymer that obtains a high conductivity due to doping, such as conductive polyaniline, conductive polypyrrole, conductive polythiophene (a complex of polyethylenedioxythiophene and polystyrene sulfonic acid), or a complex of polyethylenedioxythiophene ("PEDOT") and polystyrene sulfonic acid. When these materials are used, a contact resistance between the source and drain electrodes and the semiconductor layer may be reduced.

Among the materials for forming the source and drain electrodes described above, the source electrode and the drain electrode may be formed of a material that enables a contact surface between the source and drain electrodes and the semiconductor layer to have a small electric resistance. The electric resistance corresponds to an electric field mobility when a current-control device is manufactured, and a high electric field mobility is obtained when the electric resistance is low.

The gate, source, and drain electrodes may be formed by, for example, deposition, electron-beam deposition, sputtering, an atmospheric plasma method, ion plating, CVD, electrodeposition, electroless deposition, spin coating, printing, or ink-jetting. If patterning is further needed to form the gate, source, and drain electrodes, a conductive thin film formed by such methods may be patterned by a known photolithography or a lift-off method. Alternatively, a metal thin film formed of aluminum or copper may be patterned by forming a resist by thermal transfer or ink-jetting and then performing etching thereon. Alternatively, a solution or dispersion of a conductive polymer, or a dispersion containing a metallic particulate may be directly ink-jetted to form a pattern. Alternatively, lithography and laser polishing may be performed through a porous layer to form a pattern. Alternatively, a conductive polymer, a metallic particulate-containing conductive ink, or a conductive paste may form a pattern by relief printing, engraving printing, flat panel printing, or screen printing.

The thickness of the formed electrode may not be limited as long as a current flows therethrough, and may be, for example, in a range of about 0.2 nm to about 10 nm or about 4 nm to about 300 nm. If the thickness of each of the source and drain electrodes is within the foregoing ranges, a resistance is high due to the small thickness and thus a voltage drop may not occur.

In a TFT according to another embodiment, a buffer layer may be formed between the semiconductor layer and the source and drain electrodes in order to improve injection efficiency. In the case of an n-type TFT, the buffer layer may comprise an alkali metal salt, such as LiF, $Li_2O$, CsF, $NaCO_3$, or KCl, an alkali earth metal salt, such as $MgF_2$, or $CaCO_3$, or a compound having an ionic bond, or a combination comprising at least one of the foregoing. The foregoing may be used in an anode of an organic light-emitting device. In addition, a compound that is used to form an electron injection layer or an electron transport layer of an organic light-emitting device, such as Alq(tris(8-quinolinol)aluminum complex), may also be used to form the buffer layer.

The buffer layer lowers an injection barrier of carriers and thus lowers a threshold voltage, and enables a transistor to be driven at low voltage. The thin buffer layer may be located anywhere between the source and drain electrodes and the semiconductor layer. The thickness of the buffer layer may be in a range of about 0.1 nm to about 30 nm, or about 0.3 nm to about 20 nm.

The TFT may be electrically connected to a light-emitting device, and the light-emitting device may be controlled by changing a current flowing between the source electrode and the drain electrode. The TFT and the light-emitting device may form a flat panel display.

The embodiment will be described in further detail with reference to the following examples. These examples are for illustrative purposes only and are not intended to limit the scope of the present disclosure.

EXAMPLES

Preparation Example 1

Preparation of a Graphene Monolayer

A 2-inch 6H-SiC wafer (0001) was placed in a chamber filled with argon gas at a pressure of 680 torr and heated at a temperature of 1,200° C. for 10 minutes. Subsequently, the resulting material was slowly cooled down to form an epitaxial graphene monolayer structure having a size of 1 mm×10 mm.

Figure 3:
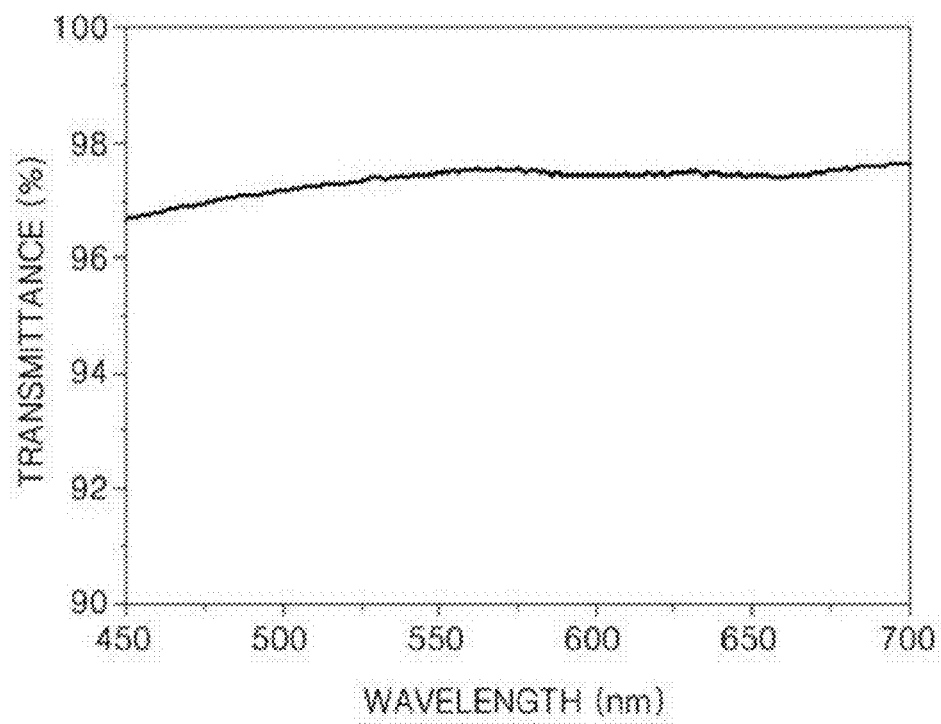
FIG. 3 is a graph of transmittance (percent, %) versus wavelength (nanometer, nm), which illustrates a light transmittance of the graphene monolayer prepared according to Preparation Example 1.

Light transmittance of the obtained graphene monolayer was measured by light absorption using light with a band of wavelengths from 450 nm to 700 nm. FIG. 3 illustrates the light transmittance of the graphene monolayer. As shown in FIG. 3, the graphene monolayer showed a light transmittance value of about 97% to about 98%. In this regard, the formation of the graphene monolayer through the method above was confirmed.

Example 1

The graphene monolayer having a size of 1 mm×10 mm obtained in Preparation Example 1 was disposed on a SiC substrate.

Subsequently, a current of 5.7 A was induced in vacuum, and a getter source (Na/nf/1.5/12/ft 10+10, available from Saes getters), which is a sodium source, was heated to form sodium (Na) on the graphene monolayer.

Figure 4:
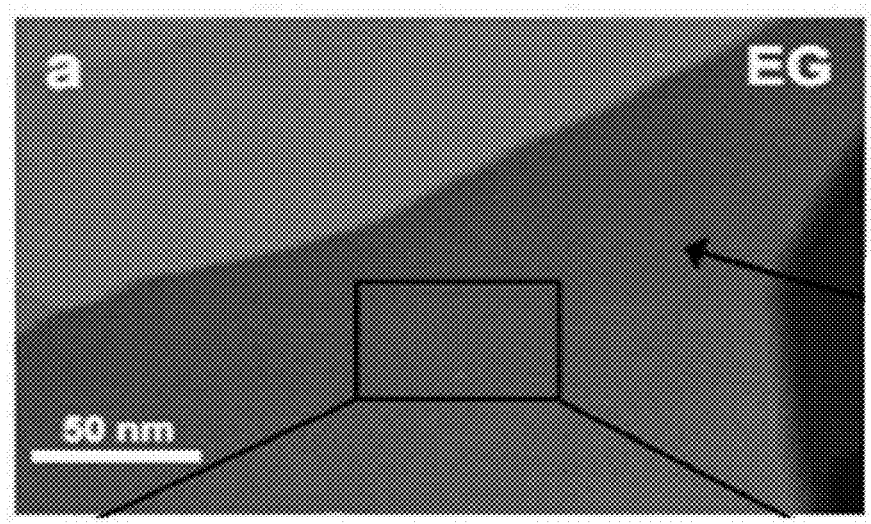
FIG. 4 is a scanning tunneling microscopy ("STM") image of the graphene monolayer obtained in Preparation Example 1.
Figure 5A:
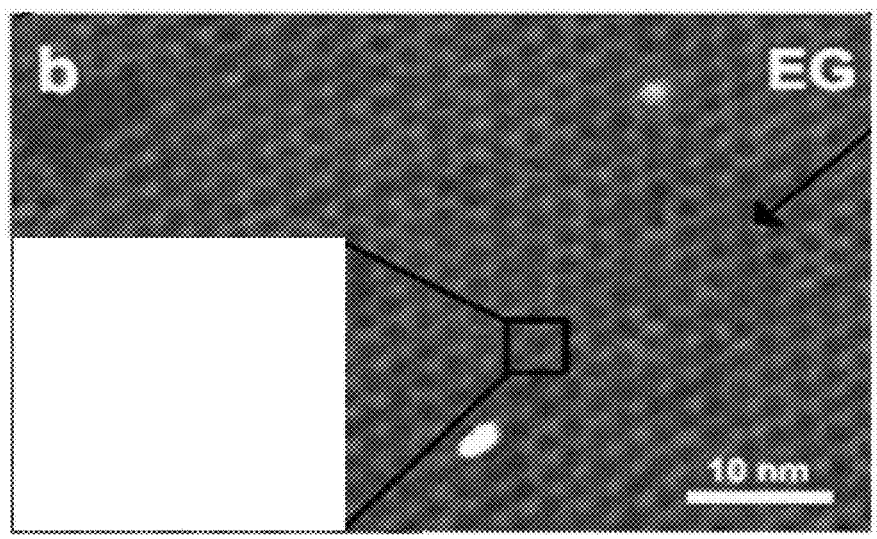
FIG. 5A illustrates an enlarged view of a box in FIG. 4.
Figure 5B:
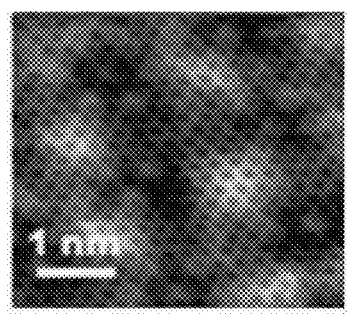
FIG. 5B is an enlarged view of the boxed area of FIG. 5A.

FIG. 4 illustrates a scanning tunneling microscope ("STM") image of the graphene monolayer obtained in Preparation Example 1, and FIG. 5A illustrates a magnified view of a box in FIG. 4, and FIG. 5B is an enlarged view of the boxed area of FIG. 5A. FIGS. 4, 5A, and 5B illustrate an initial epitaxial structure of sodium on the graphene monolayer.

Figure 6:
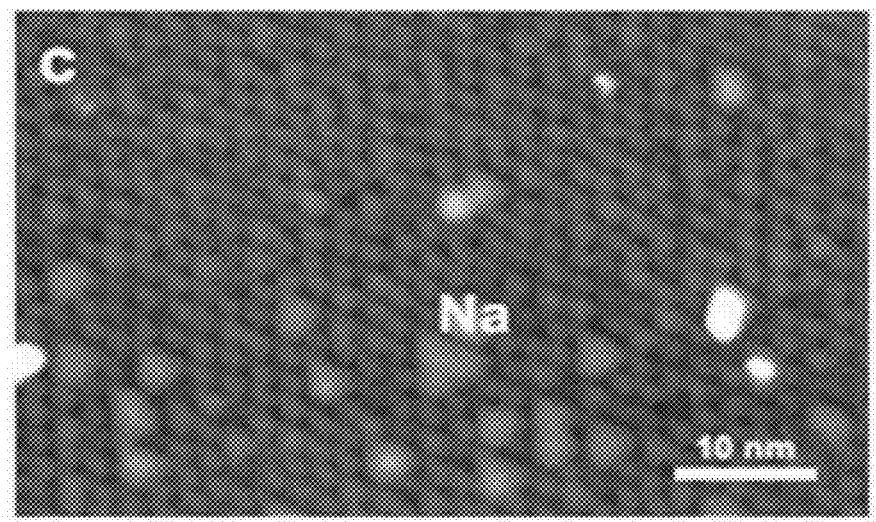
FIGS. 6 through 9 illustrate a process of depositing sodium on monolayer graphene prepared according to Example 1.
Figure 7:
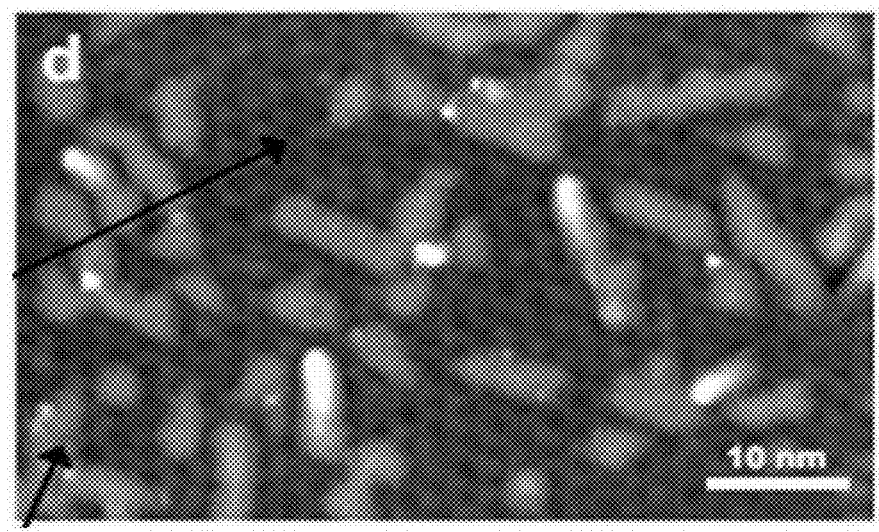
Figure 8:
Figure 9:
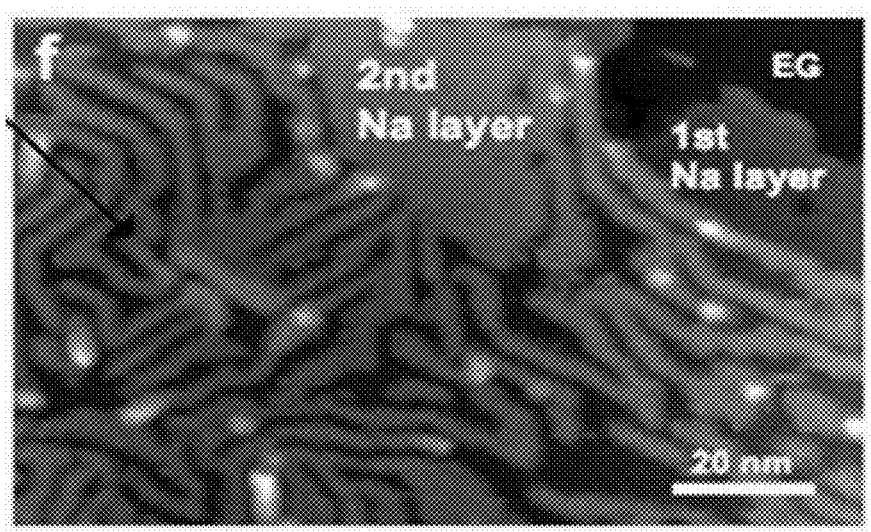

FIGS. 6 through 9 illustrate a process of gradually forming sodium on the graphene monolayer. In FIGS. 6 through 9, brighter regions indicate sodium atomic layers, and darker regions indicate the graphene. FIG. 6 shows a nanocluster of sodium, FIG. 7 shows sodium nanorods, and FIGS. 8 and 9 show a two-dimensional thin film structure of sodium.

Figure 10:
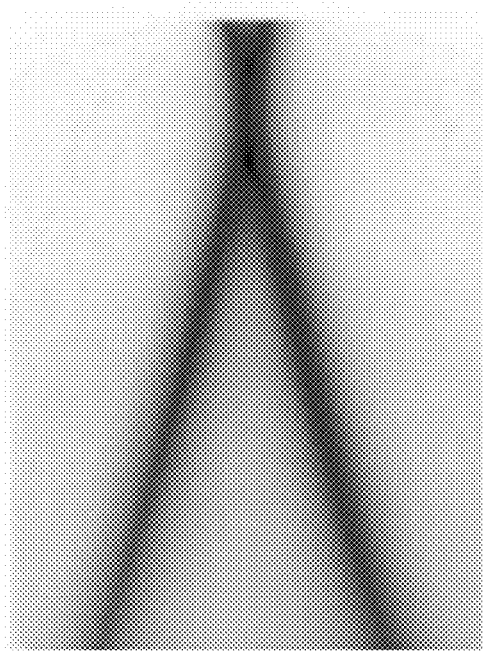
FIG. 10 illustrates a band gap of the pure graphene shown in FIG. 4.
Figure 11:
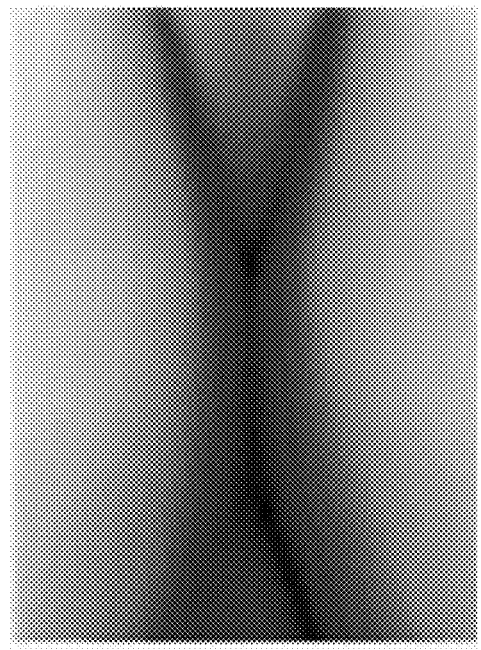
FIG. 11 shows band gap evaluation results of sodium-containing monolayer graphene prepared according to Example 1.

FIG. 10 illustrates a band gap of the pure graphene shown in FIG. 4, and FIG. 11 illustrates band gap evaluation results of the graphene monolayer on which the two-dimensional thin film structure of sodium is formed. As shown in FIG. 11, it can be seen that a band gap of about 0.6 eV was formed. The band gap evaluation results were obtained by using an optical transmission measurement method.

As described above, according to the above embodiment and while not wanting to be bound by theory, it is understood that the graphene semiconductor has a large band gap due to charge localization caused by a non-chemical bond, e.g., a physical bond, and thus as the graphene is semiconductorized, unique characteristics of graphene may be retained and semiconducting properties may be introduced to the graphene. Therefore, the graphene may be used in various electrical devices such as a transistor due to the large band gap and high mobility.

It should be understood that the exemplary embodiment described herein should be considered in a descriptive sense only and not for purposes of limitation. Descriptions of features, advantages, or aspects within each embodiment should be considered as available for other similar features or aspects in other embodiments.

What is claimed is:

1. A graphene semiconductor comprising:
   graphene;
   a metal atomic layer disposed on the graphene; and
   a first oxide layer disposed on the metal atomic layer,
   wherein the metal atomic layer comprises an alkali metal, which is capable of charge transfer with the graphene,
   the first oxide layer comprises an alkali metal oxide,
   the alkali metal oxide is an oxidation product of a surface of the metal atomic layer, and
   a thickness of the first oxide layer is in a range of about 1 nanometer to about 100 nanometers.

2. The graphene semiconductor of claim 1, wherein the metal atomic layer comprises sodium.

3. The graphene semiconductor of claim 1, wherein the metal atomic layer is disposed on a surface of the graphene.

4. The graphene semiconductor of claim 1, wherein the metal atomic layer comprises a two-dimensional film structure.

5. The graphene semiconductor of claim 1, wherein the metal atomic layer has a form of a film, a nanorod, a nanocluster, or a combination thereof.

6. The graphene semiconductor of claim 1, wherein the metal atomic layer occupies about 30% to about 99% of an entire surface of the graphene.

7. The graphene semiconductor of claim 1, wherein the graphene semiconductor has a band gap of about 0.4 electron volt or more.

8. The graphene semiconductor of claim 1, wherein the graphene semiconductor has a band gap of about 0.45 electron volt to about 0.8 electron volt.

9. The graphene semiconductor of claim 1 further comprising a second oxide layer disposed on the first oxide layer.

10. An electrical device comprising the graphene semiconductor of claim 1.

11. The electrical device of claim 10, wherein the electrical device is a sensor, a bipolar junction transistor, a field effect transistor, a heterojunction bipolar transistor, a single electron transistor, a light-emitting diode, or an organic electroluminescent diode.

12. A method of selecting a band gap of graphene, the method comprising:
    disposing graphene on a substrate;
    disposing a metal atomic layer comprising an alkali metal on the graphene; and
    forming a first oxide layer having a thickness in a range of about 1 nanometer to about 100 nanometers on the graphene by oxidizing a surface of the metal atomic layer to select the band gap of the graphene.

13. The method of claim 12, further comprising disposing a second oxide layer on the first oxide layer.

14. The method of claim 12, further comprising repeating the disposing and the forming to dispose an additional metal atomic layer on the graphene and form an additional oxide layer on the additional metal atomic layer by oxidizing the additional metal atomic layer.

* * * * *